(12) United States Patent
Vichare et al.

(10) Patent No.: US 9,927,853 B2
(45) Date of Patent: Mar. 27, 2018

(54) SYSTEM AND METHOD FOR PREDICTING AND MITIGATING CORROSION IN AN INFORMATION HANDLING SYSTEM

(71) Applicant: Dell Products, LP, Round Rock, TX (US)

(72) Inventors: Nikhil M. Vichare, Austin, TX (US); Michael T. Miller, Austin, TX (US); Mark L. Rehmann, Georgetown, TX (US); Edwin C. Tinsley, Austin, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 249 days.

(21) Appl. No.: 14/868,319

(22) Filed: Sep. 28, 2015

(65) Prior Publication Data
US 2017/0089607 A1 Mar. 30, 2017

(51) Int. Cl.
*H05K 7/20* (2006.01)
*G06F 1/20* (2006.01)

(52) U.S. Cl.
CPC ............ *G06F 1/206* (2013.01); *H05K 7/20* (2013.01)

(58) Field of Classification Search
CPC ................................ G06F 1/206; H05K 7/20
See application file for complete search history.

(56) References Cited

U.S. PATENT DOCUMENTS

| | | | |
|---|---|---|---|
| 5,446,369 A | 8/1995 | Byrne et al. | |
| 7,678,253 B2 | 3/2010 | Zamanzadeh et al. | |
| 7,818,156 B2 | 10/2010 | Vachhani et al. | |
| 8,290,629 B1 * | 10/2012 | Mateski | H05K 7/20836 137/2 |
| 9,531,202 B2 * | 12/2016 | Miller | H02J 7/0021 |
| 2010/0300284 A1 * | 12/2010 | Bash | G05D 22/02 95/10 |
| 2013/0226364 A1 * | 8/2013 | Artman | G06F 1/206 700/300 |
| 2014/0055949 A1 * | 2/2014 | Campbell | F28D 1/0471 361/691 |
| 2014/0049774 A1 | 12/2014 | Horii et al. | |
| 2015/0171491 A1 * | 6/2015 | Lim | H01M 10/625 429/50 |
| 2016/0041085 A1 * | 2/2016 | England | G01N 17/043 436/6 |

OTHER PUBLICATIONS

Remote Management with the Baseboard Management Controller in Eighth-Generation Dell PowerEdge Servers; Zhuo et al.; 4 pages; Reprinted from Dell Power Solutions, Oct. 2004.*

* cited by examiner

*Primary Examiner* — Ronald Hartman, Jr.
(74) *Attorney, Agent, or Firm* — Larson Newman, LLP

(57) ABSTRACT

An information handling system includes a central processing unit, a temperature sensor to provide temperature information, a humidity sensor to provide humidity information, and an embedded controller. The embedded controller determines a current dew point temperature based on the temperature information and the humidity information. The embedded controller activates a condensation mitigation procedure if a difference between a current temperature and the current dew point temperature is less than a threshold value stored at a register at the embedded controller. The mitigation procedure is a software program executed by the information handling system.

20 Claims, 3 Drawing Sheets

SYSTEM AND METHOD FOR PREDICTING AND MITIGATING CORROSION IN AN INFORMATION HANDLING SYSTEM

FIELD OF THE DISCLOSURE

This disclosure relates generally to information handling systems, and more particularly relates to predicting and mitigating corrosion in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
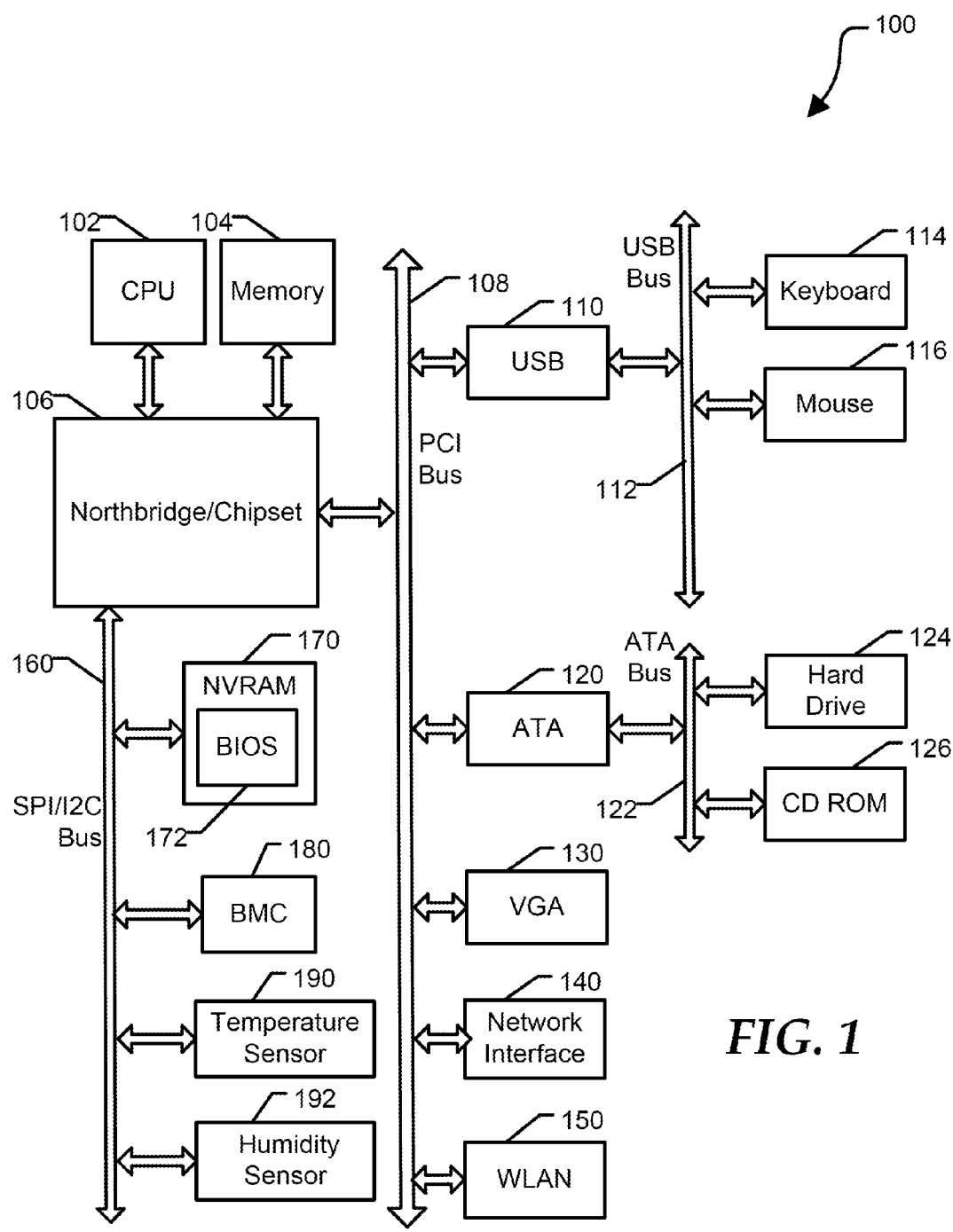
FIG. 1 is a block diagram of an information handling system according to an embodiment of the present disclosure.
Figure 2:
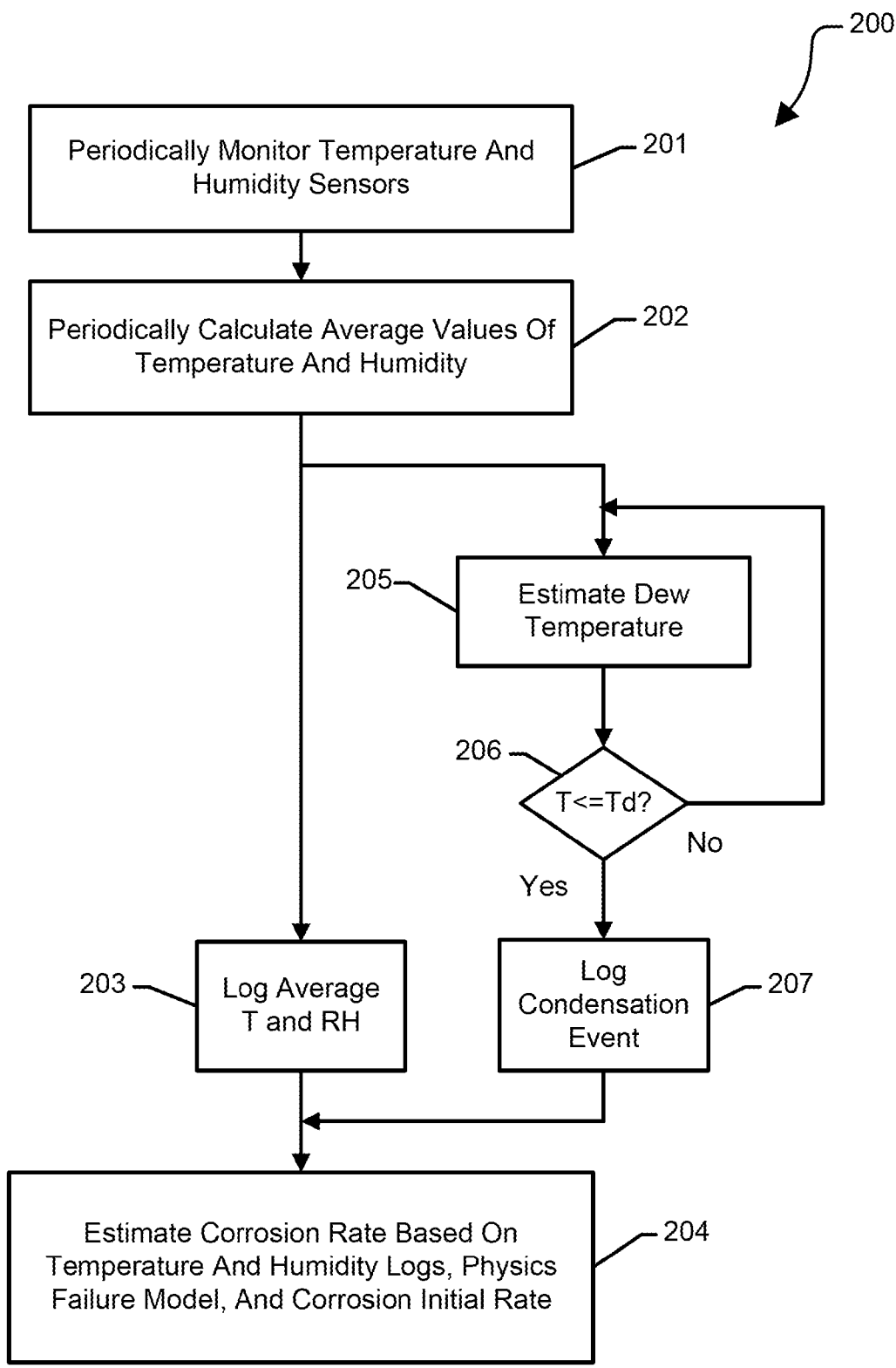
FIG. 2 is a flow diagram illustrating a method for maintaining a record of humidity and condensation events to estimate a corrosion rate at an information handling system according to a specific embodiment of the present disclosure.
Figure 3:
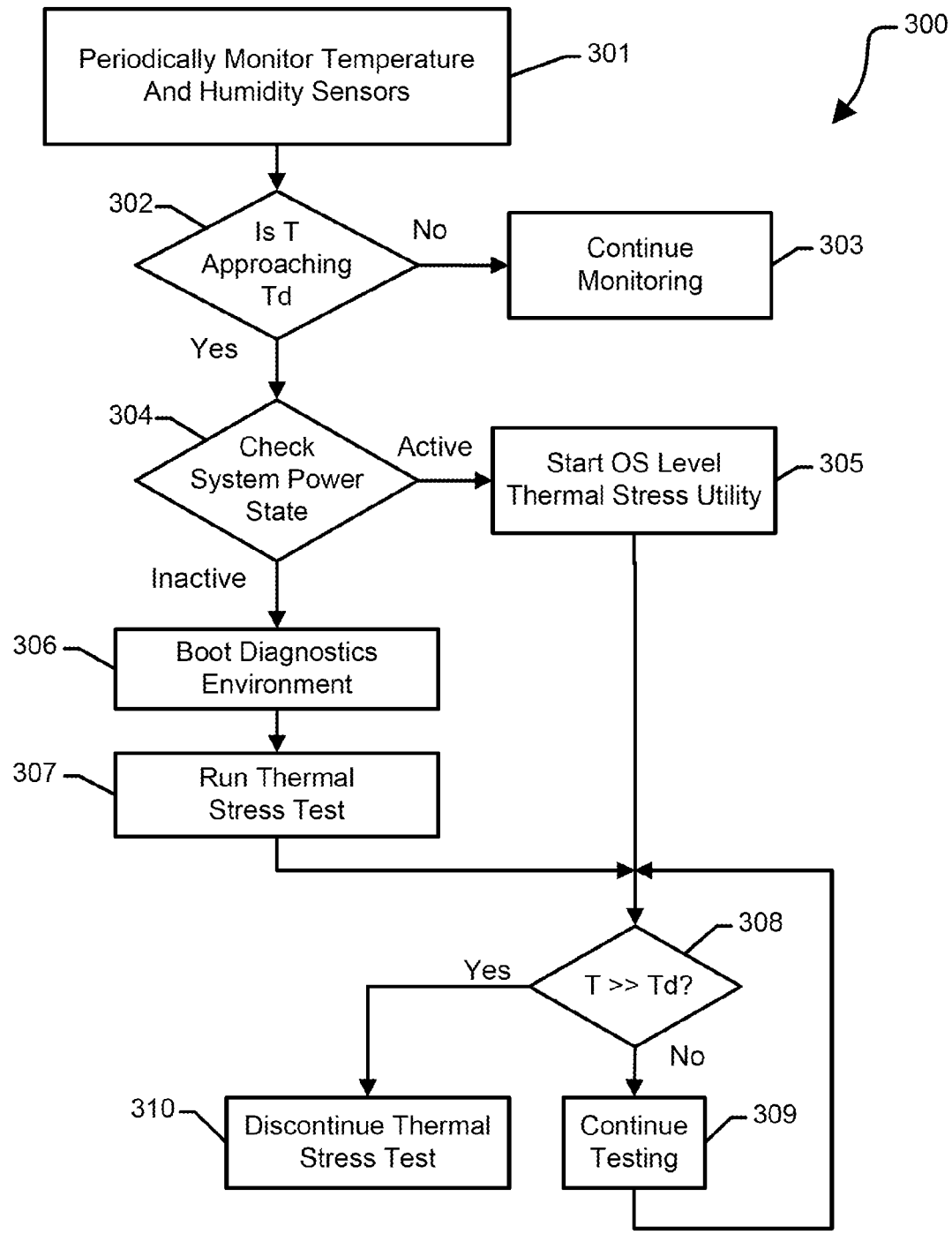
FIG. 3 is a flow diagram illustrating a method to detect and remediate condensation and corrosion at an information handling system according to a specific embodiment of the present disclosure.

FIGS. 1-3 illustrate techniques for monitoring temperature and humidity at an information handling system. The environmental data can be logged and provided to a system service provider and used to identify a likelihood of corrosion related malfunction at the information handling system. Recordation of ongoing humidity and temperature information, in addition to failure analysis data, can be used to refine the accuracy of parameters and procedures used to predict corrosion. Environmental logs and historical failure data can be used to facilitate diagnosis of a failure at an information handling system. For example, such data may predict that a device failure is due to corrosion of an electrical connector associated with the device, rather than failure of the device itself. The environmental data also can be used to initiate remediation processes at the system. For example, a processor can increase computational activity at a central processing unit or at other devices included at the information handling system in order to increase the generation of heat within the system. By raising the temperature within the system condensation can be avoided.

The logging and remediation processes can be implemented by various processors included at an information handling system, including microprocessors or microcomputers included at an embedded controller (EC), a service processor, a baseboard management controller (BMC), a battery management microcontrollers, and the like. The remediation process can include thermal stress utilities or tests that are primarily utilized to evaluate the operation of cooling infrastructure at the information handling system. When activated, the thermal stress test can increase the temperature at the information handling system and thereby minimize or eliminate condensation.

FIG. 1 illustrates an information handling system 100 including a processor 102, a memory 104, a northbridge/chipset 106, a PCI bus 108, a universal serial bus (USB) controller 110, a USB 112, a keyboard device controller 114, a mouse device controller 116, a configuration an ATA bus controller 120, an ATA bus 122, a hard drive device controller 124, a compact disk read only memory (CD ROM) device controller 126, a video graphics array (VGA) device controller 130, a network interface controller (NIC) 140, a wireless local area network (WLAN) controller 150, a serial peripheral interface (SPI) bus 160, a NVRAM 170 for storing BIOS 172, a baseboard management controller (BMC) 180, temperature sensor 190 and humidity sensor 192. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPU 102, which provides various management functions for information handling system 100. For example, an embedded controller may be responsible for power management, cooling management, and the like.

System 100 can include additional processors (not shown at FIG. 1) that are configured to provide localized or specific control functions, such as a battery management controller. Bus 160 can include one or more busses, including an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, i.e. a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and redundant bus controllers. One ore more components can be integrated together. For example, portions of northbridge/chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display. An example of information handling system 100 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as CPU 102, a programmable logic array (PLA), an embedded device such as a System-on-a-Chip (SoC), or other control logic hardware. Information handling system 100 can also include one or more computer-readable medium for storing machine-executable code, such as software or data.

Information handling system 100 can include multiple temperature sensors. For example, a battery can include a temperature sensor, in addition to an embedded controller for monitoring charging and discharging temperatures of a rechargeable battery. In one embodiment, temperature sensor 190 and humidity sensor 192 can be incorporated at a battery assembly, and the embedded controller can perform one or more of the detection, logging, and remediation techniques disclosed herein. Humidity sensor 192 is typically responsive to relative humidity; however a sensor capable of measuring absolute humidity or an approximation of either relative or absolute humidity can be utilized. For simplicity, the term humidity is used herein to mean any form of humidity measurement.

FIG. 2 is a flow diagram illustrating a method 200 for maintaining a record of humidity and condensation events to estimate a corrosion rate at an information handling system according to a specific embodiment of the present disclosure. Method 200 begins at block 201 where temperature and humidity sensors are periodically monitored at an information handling system. For example, an embedded controller, such as BMC 180, can receive current temperature information from sensor 190 and current humidity information from sensor 192. The temperature and humidity information can be collected once a minute, once every ten minutes, or at another interval. In one embodiment, one or more of sensors 190 and 192 can issue an interrupt or activate an indicator to alert the embedded controller when a change in temperature or humidity is detected. In another embodiment, a process executing at CPU 102 can perform the measurements and the following functions.

The method continues at block 202 where average values of the temperature and humidity information acquired at block 201 can be calculated. For example, the effect of short term fluctuations of humidity, and especially of temperature, can be reduced. The averaging calculation can be performed by an embedded controller, CPU 102, or by another processor included at system 100. The method proceeds to block 203 where the average temperature and humidity information can be logged. For example, a processor can store the averaged measurements at memory device local to processor performing the measurements, at system memory 104, or at another volatile or nonvolatile memory device. Method 200 continues at block 204 where a corrosion rate can be estimated based on the temperature and humidity logs, a physics failure model, and a corrosion initial rate. For example, an original equipment manufacturer (OEM) of an information handling system can perform corrosion testing of components that are incorporated into system 100, in order to determine how susceptible each component is to corrosion, referred to herein as an initial rate. A corrosion rate can be calculated using the equation:

$$\text{Corrosion Rate} = RH \times e^{[-deltaH/KT]} \times r0 \quad (1)$$

Where RH is a current or average relative humidity, r0 is an initial rate, deltaH is an activation energy associated with materials included at system 100, K is Boltzmann's constant, and T is a current or average temperature. A corrosion rate estimate can be determined based on information acquired, maintained, and refined by the OEM, including failure analysis data. For example, failure analysis of a malfunctioning information handling system can determine that the failure is due to corrosion of an electrical connector at the system. The OEM can review temperature and humidity logs maintained by the system. Over time, a correlation between temperature and humidity, and operating lifetime of the system, can be identified.

In an embodiment, the geographical location of the information handling system or other installation information can be included in a corrosion rate estimate. For example, an information handling system installed within a an air conditioned work environment will likely experience corrosion at a rate significantly lower than a system installed in a location without environmental controls, such as at remote monitoring or industrial facility. For another example, a system installed near an ocean coastline may be subjected to salt, which can greatly exacerbate corrosion.

Returning to block 202, the method also proceeds to block 205, where a dew temperature is estimated. For example, a dew temperature, also referred to as a dew point temperature, or simply dew point, can be approximated using the equation:

$$Td=T-(100-RH/5) \qquad (2)$$

Where Td is the dew temperature, T is the current or average temperature, and RH is the current or average relative humidity. This approximation is most accurate for values of relative humidity that are greater than fifty percent. In one embodiment, calculation of a dew point can be performed in response to the relative humidity increasing beyond a predetermined threshold, such as fifty percent. The method continues at decision block 206 where it determined whether the current temperature is at or below the dew temperature calculated at block 205. If the current temperature is above the calculated dew temperature, the method returns to block 205 where the dew temperature continues to be monitored. If the current temperature is at or below the calculated dew temperature, it is possible or likely that condensation of water vapor can occur within the information handling system. Corrosion, especially of metallic components, is greatly accelerated by condensation.

Method 200 continues at block 207, where the condensation event can be logged. For example, a time and duration of a condensation event can be stored with the temperature and humidity information logged at block 203. In addition, processes responsible for identifying the condensation event can forward a record of the condensation event to a system administrator or a service provider. For example, a monitoring procedure executing at BMC 180, at CPU 102, or at another embedded controller, can transmit a message identifying the condensation event to a remote location over network interface 140. The method concludes at block 204, where the corrosion rate can be calculated, as described above. Because corrosion is significantly more prominent in an environment where condensation has occurred, the corrosion estimation performed at block 204 may be performed only in response to detecting a condensation event.

FIG. 3 is a flow diagram illustrating a method 300 to detect and remediate condensation and corrosion at an information handling system according to a specific embodiment of the present disclosure. Method 300 begins at block 301 where temperature and humidity sensors included at an information handling system are periodically monitored. For example, BMC 180, another embedded controller, or CPU 102 can execute program code to implement a monitoring routine, wherein temperature sensor 190 and humidity sensor 192 are polled at a predetermined interval. The temperature and humidity information can be averaged and logged, and a dew temperature can be calculated, as described above with reference to FIG. 2. The method continues at decision block 302 where the monitoring routine can determine whether the current or average temperature, T, is approaching a calculated dew temperature, Td. For example, as the temperature at information handling system 100 declines, or the humidity increases, the temperature may approach the calculated dew temperature. If the current temperature has not yet approached the dew temperature, the method proceeds to block 303 where monitoring continues. For example, blocks 301 and 302 are repeated. If the current temperature is approaching the dew temperature, the method proceeds to decision block 304 where a remediation process is initiated.

At decision block 304 a determination is made regarding which power state the information handling system is currently operating in. If the system is currently operating normally, method 300 proceeds to block 305 where an operating system level thermal stress utility is started. The thermal stress test is typically a computation-intensive operation performed by CPU 102, a graphics processing unit, or the like. However, the stress test can be localized to one or more hardware devices, such as a network interface controller. Elevated circuit activity, increased clock rates, elevated power levels, and the like can increase a production of heat within information handling system 100. As described above, the thermal stress test is typically employed to verify correct operation of a cooling infrastructure provided by system 100, such as fans, heat pipes, radiators, and the like. In an embodiment, the thermal stress utility can be administered under system management mode (SMM) in response to a system management interrupt (SMI) issued by an embedded controller.

Returning to decision block 304, if the system is currently shutdown, or operating in a sleep or hibernating mode of operation, method 300 proceeds to block 306 where system 100 initialized and configured to operate in a boot-diagnostics environment, such as a pre-boot application. The boot diagnostic environment is a mode of operation that can be initiated prior to loading a primary operating system. The method continues at block 307 where a thermal stress test is initiated. In either type of thermal stress test, all or portion of the system cooling mechanisms can be partially or fully disabled so as to further increase temperatures within system 100. One of skill will appreciate that while an already existing thermal stress test can be repurposed for mitigation of a condensation event, a heat-generating procedure can be implemented that is dedicated to condensation mitigation.

Once a thermal stress test routine has been initiated, at blocks 305 or 307, the method proceeds to decision block 308, where a current operating temperature of system 100 is again compared to a dew temperature. Because the relative humidity and dew temperatures are a function of temperature, periodic measurements of current temperature and humidity at system 100 provided by sensors 190 and 192 can be used to monitor the effectiveness of the mitigation procedure. If the current temperature is greater than the dew temperature, the method proceeds to block 310 where the thermal stress test can be terminated. For example, BMC 180 can calculate a difference between the current temperature and the current dew temperature. If the temperature exceeds the dew temperature by a predetermined value, the heat-generating activities can be discontinued.

In one embodiment, the thermal stress test can include two or more levels of heat-generating activity. For example, a thermal stress test can be initially configured to generate considerable heat, and the process can be throttled down in response to determining the dew temperature is falling relative to the temperature at the system. Returning to decision block 308, if the current temperature is not greater than the dew temperature, the method proceeds to block 310 where the thermal stress test can be continued and the method returns to decision block 308 where the temperature and dew temperature are compared. If power to information handling system 100 is provided only by a battery, the mitigation procedure can be discontinued or fully preempted based on a present charge level of the battery.

At any time during execution of methods 200 and 300, information relating to humidity, dew temperature, or a condensation event can be transmitted to a system administrator or a service provider that is responsible for support or maintenance of information handling system 100. For example, such transmission can be triggered by detection of a condensation event at system 100. Alternatively, a remote support entity can manually or automatically interrogate system 100, requesting the environmental information.

Referring back to FIG. 1, the information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media. A network interface device (not shown at FIG. 1) can provide connectivity to a network, such as a wide area network (WAN), a local area network (LAN), or other network.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
   a central processing unit;

a temperature sensor to provide temperature information;
a humidity sensor to provide humidity information; and
an embedded controller including firmware instructions executable by the embedded controller to:
  determine a current dew point temperature based on the temperature information and the humidity information; and
  activate a condensation mitigation procedure if a difference between a current temperature and the current dew point temperature is less than a threshold value stored at the information handling system, the condensation mitigation procedure consisting of a software program executed by the information handling system, execution of the software program to generate heat at the information handling system.

2. The system of claim 1, wherein the software program comprises a thermal stress test configured to verify correct operation of a cooling system at the information handling system.

3. The system of claim 1, wherein the embedded controller is further to:
  determine a condensation event has occurred based on the temperature information and the current dew point temperature; and
  store a record of the condensation event at the information handling system.

4. The system of claim 1, wherein the embedded controller is further to:
  periodically store the temperature information and humidity information at a memory device; and
  provide the stored information to a service provider in order for the service provider to predict whether a system failure at the information handling system is a result of corrosion.

5. The system of claim 1, wherein the embedded controller is further to:
  retrieve an initial corrosion rate parameter from a first register at the information handling system; and
  determine a current corrosion rate based on the temperature and humidity information and based on the initial corrosion rate; and
  store the current corrosion rate at a second register at the information handling system.

6. The system of claim 1, wherein the embedded controller is a baseboard management controller at the information handling system.

7. The system of claim 1, wherein the embedded controller is a battery management controller included at a battery at the information handling system.

8. The system of claim 1, wherein the humidity sensor is included at a battery at the information handling system.

9. The system of claim 1, wherein the temperature and humidity information are average values calculated over a predetermined interval of time.

10. The system of claim 1, wherein
  the condensation mitigation procedure consists of a software program executed by the central processing unit.

11. The system of claim 1, wherein the embedded controller is further to activate the condensation mitigation procedure without regard to a current operating mode of the information handling system.

12. A method comprising:
  receiving temperature information from a temperature sensor included at an information handling system;
  receiving humidity information from a humidity sensor included at the information handling system;
  determining a current dew point temperature based on the temperature and humidity information; and
  activating a condensation mitigation procedure if a difference between a current temperature and the current dew point temperature is less than a threshold value stored at the information handling system, the condensation mitigation procedure consisting of a software program executed by a processing device at the information handling system, execution of the software program to generate heat at the information handling system.

13. The method of claim 12, further comprising
  retrieving an initial corrosion rate parameter from a first register at the information handling system; and
  determining a current corrosion rate based on the temperature and humidity information and based on the initial corrosion rate; and
  storing the current corrosion rate at a second register at the information handling system.

14. The method of claim 12, wherein the software program comprises a thermal stress test configured to verify correct operation of a cooling system at the information handling system.

15. The method of claim 12, further comprising:
  determining a condensation event has occurred based on the temperature information and the dew point temperature; and
  storing a record of the condensation event at the information handling system.

16. The method of claim 12, further comprising;
  periodically storing the temperature information and humidity information at a memory device at the information handling system; and
  providing the stored information to a service provider in order for the service provider to predict whether a system failure at the information handling system is a result of corrosion.

17. The method of claim 12, wherein the receiving, comparing, and initiating is performed by an embedded controller included at the information handling system.

18. A method comprising:
  receiving temperature and humidity information provided by sensors included at an information handling system;
  receiving information identifying execution of a condensation remediation procedure at the information handling system;
  maintaining historical failure analysis data associated with the information handling system;
  identifying a correlation between the temperature and humidity information and failures relating to component corrosion at the information handling system, and
  activating a condensation mitigation procedure at a second information handling system based on the identified correlation.

19. The method of claim 18, further comprising determining a corrosion rate associated with components at the information handling system based on the received information and based on the historical failure analysis data.

20. The method of claim 18, wherein the condensation remediation procedure comprises executing a thermal stress test at the information handling system.

* * * * *